US010782120B2

(12) United States Patent
Safrani

(10) Patent No.: US 10,782,120 B2
(45) Date of Patent: Sep. 22, 2020

(54) DUAL-INTERFEROMETRY WAFER THICKNESS GAUGE

(71) Applicant: KLA-Tencor Corporation, Milpitas, CA (US)

(72) Inventor: Avner Safrani, Misgav (IL)

(73) Assignee: KLA Corporation, Milpitas, CA (US)

(*) Notice: Subject to any disclaimer, the term of this patent is extended or adjusted under 35 U.S.C. 154(b) by 0 days.

(21) Appl. No.: 16/447,637

(22) Filed: Jun. 20, 2019

(65) Prior Publication Data

US 2020/0011654 A1 Jan. 9, 2020

Related U.S. Application Data

(60) Provisional application No. 62/693,573, filed on Jul. 3, 2018.

(51) Int. Cl.
*G01B 11/24* (2006.01)
*G01B 9/02* (2006.01)
(Continued)

(52) U.S. Cl.
CPC ...... *G01B 11/0675* (2013.01); *G01B 9/02027* (2013.01); *G01B 11/2441* (2013.01); *H01L 22/12* (2013.01)

(58) Field of Classification Search
CPC .............. G01B 9/02021; G01B 9/02027; G01B 11/06; G01B 11/0675; G01B 11/2441
See application file for complete search history.

(56) References Cited

U.S. PATENT DOCUMENTS 6,353,473 B1 3/2002 Ishimori et al.
6,504,615 B1 1/2003 Abe et al.
(Continued)

FOREIGN PATENT DOCUMENTS

JP 2003232617 A 8/2003
KR 101785075 B1 10/2017

OTHER PUBLICATIONS

Brunner, Timothy A. et al., "Characterization of wafer geometry and overlay error on silicon wafers with nonuniform stress", Journal of Micro/Nanolithography, MEMS, and MOEMS, SPIEDigitalLibrary.org/jm3, Oct.-Dec. 2013, vol. 12(4), pp. 043002-1-043002-11.
(Continued)

*Primary Examiner* — Jonathan M Hansen
(74) *Attorney, Agent, or Firm* — Suiter Swantz pc llo

(57) ABSTRACT

A thickness measurement system may include an illumination source, a beam splitter to split illumination from the illumination source into two beams, a translation stage configured to translate a reference sample along a measurement direction, a first interferometer to generate a first interferogram between a first surface of a test sample and a first surface of the reference sample, and a second interferometer to generate a second interferogram between a second surface of the test sample and a second surface of the reference sample. A thickness measurement system may further include a controller to receive interference signals from the first and second interferometers as the translation stage scans the reference sample, and determine a thickness of the test sample based on the thickness of the reference sample and a distance travelled by the translation stage between peaks of envelopes of the interference signals.

29 Claims, 11 Drawing Sheets

(51) Int. Cl.
    *G01B 11/06*     (2006.01)
    *H01L 21/66*     (2006.01)

(56) References Cited

U.S. PATENT DOCUMENTS

| | | |
|---|---|---|
| 6,847,458 B2 | 1/2005 | Freischlad et al. |
| 7,593,100 B2 | 9/2009 | Okita |
| 7,847,954 B2 | 12/2010 | Tang et al. |
| 8,537,369 B1 * | 9/2013 | Tang ................. G01B 11/0675 356/503 |
| 9,121,684 B2 | 9/2015 | Tang et al. |
| 9,354,526 B2 | 5/2016 | Vukkadala et al. |
| 9,651,359 B2 | 5/2017 | Chen et al. |
| 9,752,865 B1 | 9/2017 | Haight et al. |
| 2005/0280829 A1 | 12/2005 | Unruh et al. |
| 2006/0139656 A1 | 6/2006 | Kulawiec et al. |
| 2010/0208272 A1 | 8/2010 | Tang et al. |
| 2012/0002213 A1 | 1/2012 | Kannaka et al. |
| 2012/0300213 A1 * | 11/2012 | Frankovich .......... G01B 11/161 356/450 |
| 2014/0293291 A1 | 10/2014 | Tang |
| 2015/0176973 A1 | 6/2015 | Tang et al. |

OTHER PUBLICATIONS

Lee, Honggoo et al., "Patterned Wafer Geometry Grouping for Improved Overlay Control", Proc. of SPIE, vol. 10145, Downloaded on Apr. 4, 2017, pp. 101450O-1-101450O-8.
International Search Report and Written Opinion dated Oct. 21, 2019 for PCT/US2019/040213.

* cited by examiner

DUAL-INTERFEROMETRY WAFER THICKNESS GAUGE

CROSS-REFERENCE TO RELATED APPLICATION

The present application claims the benefit under 35 U.S.C. § 119(e) of U.S. Provisional Application Ser. No. 62/693,573, filed Jul. 3, 2018, entitled Dual Interferometry Wafer Thickness Gauge, naming Avner Safrani as inventor, which is incorporated herein by reference in the entirety.

TECHNICAL FIELD

The present disclosure relates generally to sample thickness measurements and, more particularly, to interferometric sample thickness measurements.

BACKGROUND

Accurate measurements of the absolute thickness of thin samples such as, but not limited to, semiconductor wafers are widely useful, particularly in semiconductor fabrication and metrology. For example, high-resolution thickness measurements of samples may be used to determine the strain associated with fabricated features on a sample, which may be indicative of potential defects. By way of another example, certain tools such as, but not limited to, X-ray metrology tools, have relatively slow focusing mechanisms such that accurate measurements of sample thickness may facilitate efficient alignment of the sample. Further, it is generally desirable to provide thickness measurement techniques that may be broadly applied to a wide variety of samples including patterned and unpatterned samples or samples having a wide variety of physical, optical, or mechanical properties. Additionally, approaches to thickness measurements must be balanced against increases in cost, system complexity, and system reliability. It may therefore be desirable to develop system and methods for accurate and efficient thickness measurements.

SUMMARY

A system is disclosed in accordance with one or more illustrative embodiments of the present disclosure. In one illustrative embodiment, the system includes a controller communicatively coupled to a first interferometer and a second interferometer. In another illustrative embodiment, the controller receives a first interference signal from the first interferometer, where the first interferometer generates a first interferogram between a first surface of a test sample and a first surface of a reference sample having a known thickness with a first illumination beam as at least one of the test sample or the reference sample is scanned along a measurement direction. For example, the first illumination beam may include a first portion of an illumination beam from a beamsplitter. In another illustrative embodiment, the controller receives a second interference signal from the second interferometer, where the second interferometer generates a second interferogram between a second surface of the test sample and a second surface of the reference sample with a second illumination beam. For example, the second illumination beam may include a second portion of the illumination beam from the beamsplitter. In another illustrative embodiment, the controller determines a thickness of the test sample along the measurement direction based on the thickness of the reference sample and a distance travelled by the translation stage between peaks of envelopes of the first and second interference signals.

A system is disclosed in accordance with one or more illustrative embodiments of the present disclosure. In one illustrative embodiment, the system includes an illumination source. In another illustrative embodiment, the system includes a beam splitter configured to split illumination from the illumination source into a first illumination beam and a second illumination beam. In another illustrative embodiment, the system includes a translation stage configured to linearly translate a reference sample along a measurement direction, where the reference sample has a known thickness. In another illustrative embodiment, the system includes a first interferometer configured to generate a first interferogram between a first surface of a test sample and a first surface of the reference sample with the first illumination beam. In another illustrative embodiment, the system includes a second interferometer configured to generate a second interferogram between a second surface of the test sample and a second surface of the reference sample with the second illumination beam. In another illustrative embodiment, the system includes a controller communicatively coupled to the first and second interferometers. In another illustrative embodiment, the controller receives first and second interference signals from the first and second interferometers including interference fringe strengths of the first and second interferograms as the translation stage scans the reference sample along the measurement direction. In another illustrative embodiment, the controller determines a thickness of the test sample along the measurement direction based on the thickness of the reference sample and a distance travelled by the translation stage between peaks of envelopes of the first and second interference signals.

A method is disclosed in accordance with one or more illustrative embodiments of the present disclosure. In one illustrative embodiment, the method includes scanning at least one of a test sample or a reference sample having a known thickness along a measurement direction. In another illustrative embodiment, the method includes receiving a first interference signal from a first interferometer associated with a first interferogram between a first surface of the test sample and a first surface of the reference sample with a first illumination beam, where the first illumination beam includes a first portion of an illumination beam from a beamsplitter. In accordance with one or more illustrative embodiments of the present disclosure, the method includes receiving a second interference signal from the second interferometer associated with a second interferogram between a second surface of the test sample and a second surface of the reference sample with a second illumination beam, where the second illumination beam includes a second portion of the illumination beam from the beamsplitter. In accordance with one or more illustrative embodiments of the present disclosure, the method includes determining a thickness of the test sample along the measurement direction based on the thickness of the reference sample and a distance travelled by the translation stage between peaks of envelopes of the first and second interference signals.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which.

DETAILED DESCRIPTION

Figure 1A:
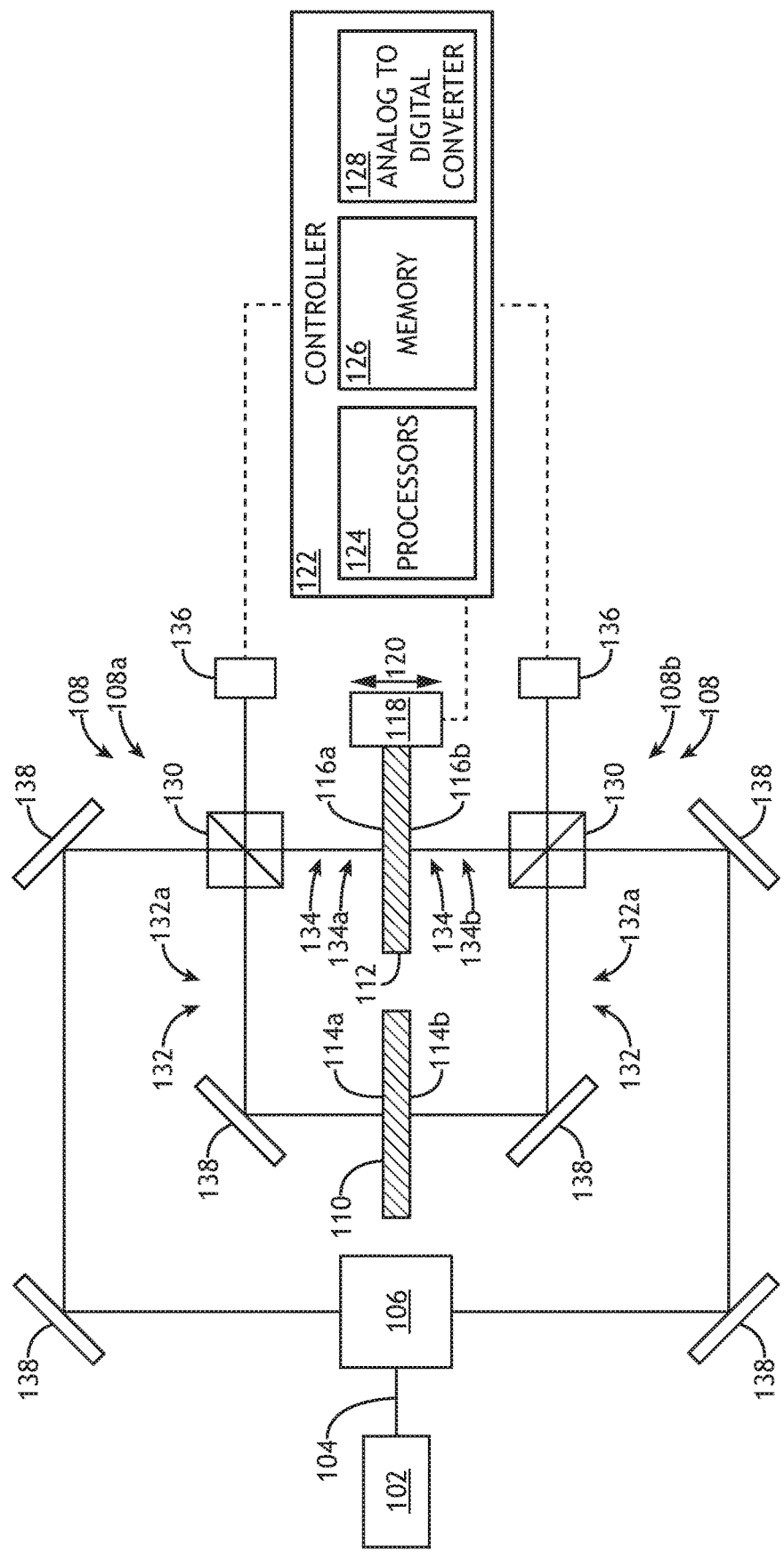
FIG. 1A is a conceptual view of a dual-interferometer sample thickness gauge, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for measuring the absolute thickness of a sample using dual interferometers and a common reference sample. A dual-interferometer thickness measurement system as described herein may include two interferometers arranged to generate interferograms between opposing sides of a test sample and opposing sides of a reference sample having two opposing optically-polished surfaces and a known thickness. For example, a first interferometer may generate an interferogram between a first surface of the test sample and a first surface of the reference sample, and a second interferometer may generate an interferogram between a second surface of the test sample and a second surface of the reference sample. A dual-interferometer thickness measurement system may further include a low-coherence optical light source such as, but not limited to, a broadband laser source such that the interferometers generate interference fringes only when arms of the interferometers are matched within a limited range based on the coherence length of the light source. In particular, an envelope function (e.g., a fringe envelope) associated with a strength of interference fringes may exhibit a peak when the arms of an interferometer are matched and may diminish as the length difference between the arms of the interferometer exceeds the coherence length in either direction.

In some embodiments, an absolute thickness measurement of the test sample is generated by translating either the test or the reference sample along the measurement direction and determining the absolute thickness of the test sample based on a translation distance of the translated sample between peaks of the fringe envelopes of the two interferometers (e.g., a peak separation distance) and the known sample thickness.

The systems and methods may provide thickness measurements for a single location on the test sample or an expanded area on the test sample depending on the illumination conditions and the type of detector used. In some embodiments, the light source is focused to opposing spots on the test and reference samples. Accordingly, each interferometer may include a single-pixel detector to capture fringe strength associated with the illuminated locations. In some embodiments, the light source is collimated or otherwise directed to opposing extended areas on the test and reference samples. Accordingly, each interferometer may include a multi-pixel detector to simultaneously capture fringe strength associated with a plurality of spots in the illumination areas. In this regard, a two-dimensional thickness map within the illuminated areas may be captured in a single measurement.

It is recognized herein that dual-interferometry thickness measurements described herein may provide highly accurate and efficient thickness measurements.

For example, the use of two interferometers to simultaneously generate interferograms between opposing sides of test and reference samples provides excellent synchronization between the two interferograms with a linear relationship between the peak separation distance and the test sample thickness, thus enabling highly accurate measurements. Further, the measurement repeatability may be based on the repeatability of the translation and sampling systems rather than position errors of reference components. When simultaneously generating dual interferograms based on a single linear scan, measurement repeatability may be based on the repeatability of a linear encoder in the translation system. For instance, current encoder systems may provide, but are not limited to, a repeatability of +/−1 nm.

Additionally, since the measurement is differential, the scanning distance for which the entire system needs to be stable is relatively small such that most mechanical parts are suitable for operation with minimal system-generated noise. For instance, the thickness of a 300 mm semiconductor wafers typically varies between 750 and 850 μm such that a thickness measurement with an 800 nm reference sample would require stable operation over a range of approximately 50 μm. With a translation speed of 250 mm/s as a nonlimiting example, the temporal stability is only approximately 200 μs.

By way of another example, dual-interferometry thickness measurements described herein may be suitable for thickness measurements of a broad range of samples with varying optical, physical, or mechanical properties including patterned or unpatterned surfaces. For instance, the light source may be selected or tuned to provide a desired spectrum corresponding to the reflectance of test samples to be measured. Further, the impact of film layers on a sample on interferograms may be well understood and taken into account when performing thickness measurements.

FIG. 1A is a conceptual view of a dual-interferometer sample thickness gauge 100, in accordance with one or more embodiments of the present disclosure.

In one embodiment, the sample thickness gauge 100 includes a light source 102 to generate a source beam 104 having a limited or known temporal coherence length. In this regard, the light source 102 may be a low-coherence source, a partially-coherent source, or the like. In another embodiment, the sample thickness gauge 100 includes a source beam splitter 106 to split the source beam 104 such that portions of the source beam 104 may be directed to the interferometers 108. The source beam splitter 106 may include any type of beamsplitter known in the art including, but not limited to, a fiber-based beamsplitter, a cube beamsplitter, or a plate beamsplitter.

In another embodiment, the sample thickness gauge 100 includes two interferometers 108 (e.g., interferometers 108a and 108b) arranged to generate interferograms based on reflections from opposing surfaces of a test sample 110 and a reference sample 112. Further, the reference sample 112 may include two opposing optically smooth surfaces with a known or calibrated thickness along the measurement direction 120.

For example, as illustrated in FIG. 1A, a first interferometer 108a may generate an interferogram between a first test surface 114a of the test sample 110 and a first reference surface 116a of the reference sample 112, while a second interferometer 108b may generate an interferogram between a second test surface 114b of the test sample 110 and a second reference surface 116b of the reference sample 112.

In another embodiment, the sample thickness gauge 100 includes at least one linear translation stage 118 for translating at least one of the reference sample 112 or the test sample 110 along a measurement direction 120 (e.g., a direction along which thickness of the test sample 110 is to be measured). For example, FIG. 1A illustrates a linear translation stage 118 positioned to translate the reference sample 112 along the measurement direction 120. However, though not shown, the sample thickness gauge 100 may include a linear translation stage 118 to translate the test sample 110. Further, the sample thickness gauge 100 may include two linear translation stages 118 to position both the reference sample 112 and the test sample 110.

In another embodiment, the sample thickness gauge 100 includes a controller 122. In another embodiment, the controller 122 includes one or more processors 124 configured to execute program instructions maintained on a memory medium 126 (e.g., memory). In this regard, the one or more processors 124 of controller 122 may execute any of the various process steps described throughout the present disclosure.

The one or more processors 124 of a controller 122 may include any processing element known in the art. In this sense, the one or more processors 124 may include any microprocessor-type device configured to execute algorithms and/or instructions. In one embodiment, the one or more processors 124 may consist of a desktop computer, mainframe computer system, workstation, image computer, parallel processor, or any other computer system (e.g., networked computer) configured to execute a program configured to operate the sample thickness gauge 100, as described throughout the present disclosure. It is further recognized that the term "processor" may be broadly defined to encompass any device having one or more processing elements, which execute program instructions from a non-transitory memory medium 126.

The memory medium 126 may include any storage medium known in the art suitable for storing program instructions executable by the associated one or more processors 124. Further, the memory medium 126 may store any type of data for use by any component of the sample thickness gauge 100 such as, but not limited to, interferograms generated by the interferometers 108. For example, the memory medium 126 may include a non-transitory memory medium. By way of another example, the memory medium 126 may include, but is not limited to, a read-only memory, a random-access memory, a magnetic or optical memory device (e.g., disk), a magnetic tape, a solid-state drive and the like. It is further noted that memory medium 126 may be housed in a common controller housing with the one or more processors 124. In one embodiment, the memory medium 126 may be located remotely with respect to the physical location of the one or more processors 124 and controller 122. For instance, the one or more processors 124 of controller 122 may access a remote memory (e.g., server), accessible through a network (e.g., internet, intranet and the like). Therefore, the above description should not be interpreted as a limitation on the present invention but merely an illustration.

Additionally, the controller 122 and any associated components (e.g., the processors 124, the memory medium 126, or the like) may include one or more controllers housed in a common housing or within multiple housings. Further, the controller 122 may be integrated with and/or perform the functions of any components in the sample thickness gauge 100.

In another embodiment, the controller 122 includes at least one analog to digital converter 128 to sample and digitize analog signals from the interferometers 108 associated with the interferograms. Further, the analog to digital converter 128 may sample signals using any technique. For example, the analog to digital converter 128 may sample signals at defined intervals based on an internal clock. By way of another example, the analog to digital converter 128 may sample signals based on a trigger signal. In one embodiment, the linear translation stage 118 provides a hardware position trigger at selected position intervals to the analog to digital converter 128 to provide sampling at selected locations of the linear translation stage 118.

The controller 122 may perform any number of processing or analysis steps disclosed herein including, but not limited to, receiving interferograms from the interferometers 108, analyzing the interferograms, or performing thickness measurements of the test sample 110 based on the interferograms. Further, the controller 122 may employ any number of algorithms, process flows, or the like.

Figure 1B:
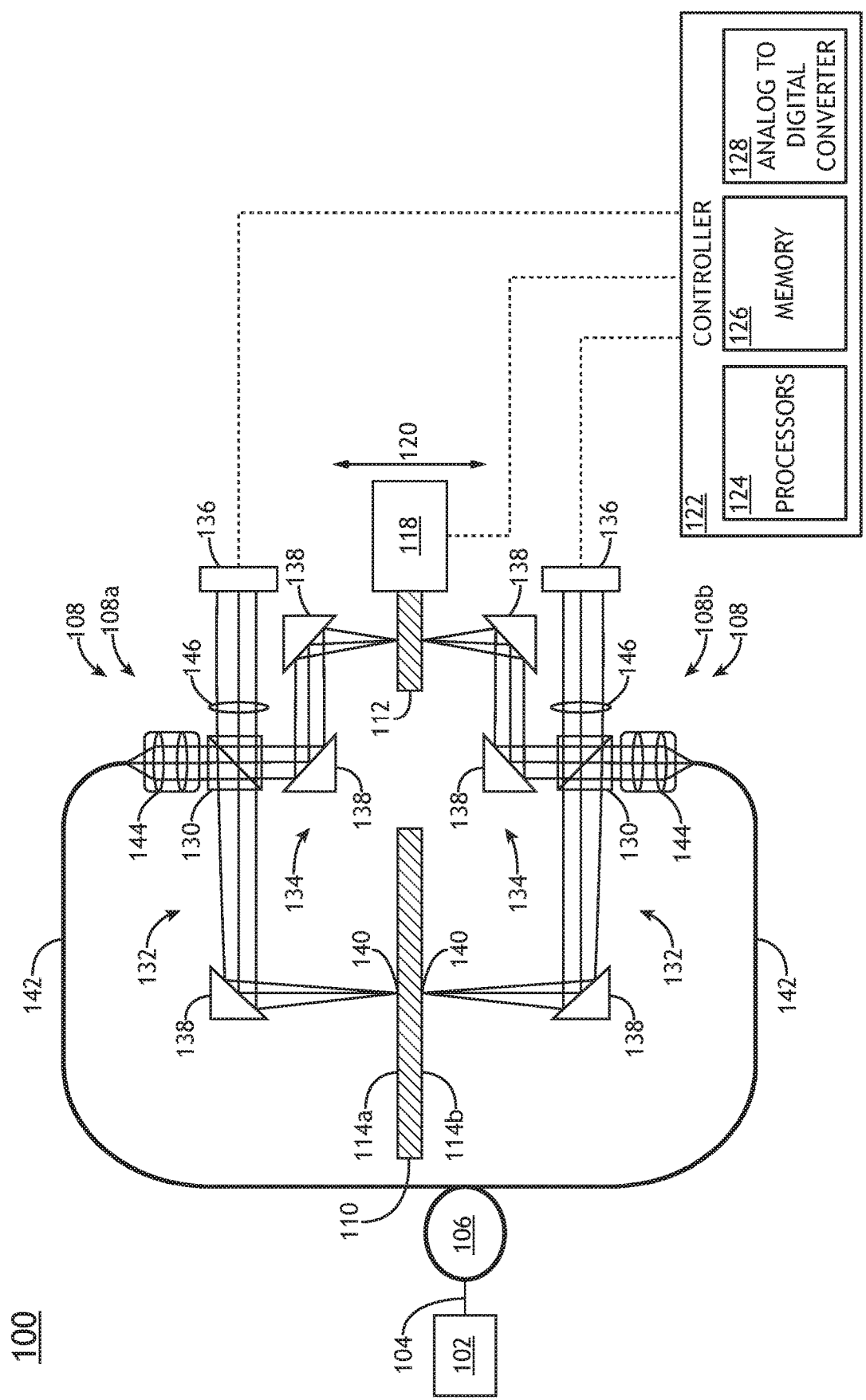
FIG. 1B is a conceptual view of the sample thickness gauge arranged to focus the source beam to a diffraction-limited spot size on the test sample and the reference sample, in accordance with one or more embodiments of the present disclosure.
Figure 1C:
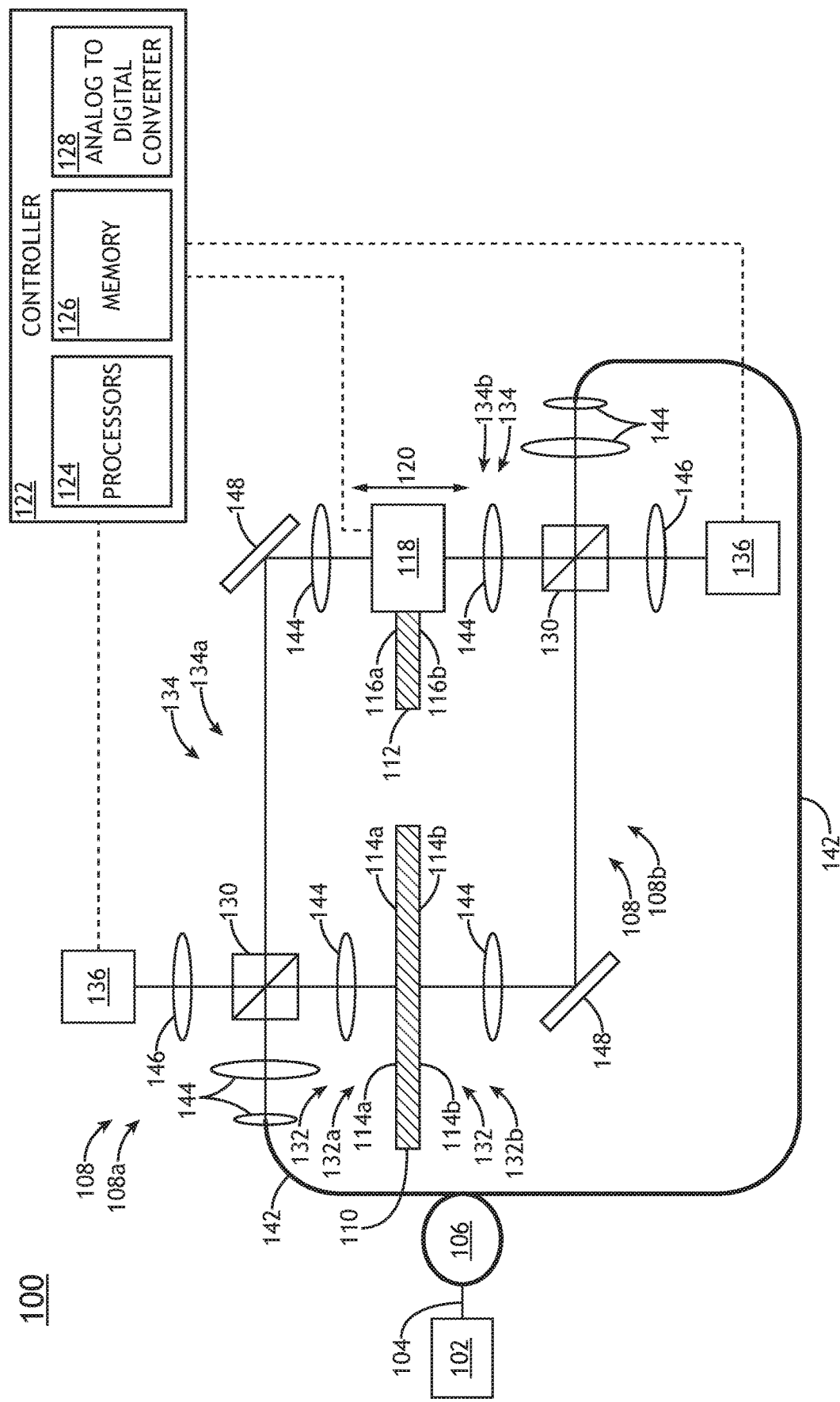
FIG. 1C is a conceptual view illustrating a sample thickness gauge including a mirror in a reference arm but not in the sample arm of the first interferometer, but including a mirror in a sample arm but not in the second interferometer, in accordance with one or more embodiments of the present disclosure.

Referring now generally to FIGS. 1A through 1C, various components of the sample thickness gauge 100 will be described in greater detail.

The light source 102 may include any type of light source known in the art suitable for providing a source beam 104 having a limited or otherwise known coherence length. It is recognized herein that a signal strength of interference fringes between the test sample 110 and the reference sample 112 in each of the interferometers 108 will peak when arms of the interferometers 108 have equal lengths. Further, the signal strength of the interference fringes will drop off as the optical path length difference between the arms of the interferometers 108 exceeds the temporal coherence length of the source beam 104. The signal strength of interference fringes from each of the interferometers 108 may thus be characterized by envelope functions having peaks where the optical path length difference between the arms of the interferometers 108 are matched and having a half-width related to the temporal coherence length of the source beam 104. Accordingly, the temporal coherence length of the source beam 104 may be selected to provide a desired envelope width.

In one embodiment, the light source 102 is a laser source. For example, the light source 102 may include one or more broadband lasers such as, but not limited to, one or more supercontinuum lasers or white-light lasers. By way of another example, the light source 102 may include one or more superluminescence laser diodes (SLDs). In another embodiment, the light source 102 includes one or more light emitting diodes (LEDs). In another embodiment, the light source 102 includes a lamp source such as, but not limited to, an arc lamp, a discharge lamp, an electrode-less lamp, or the like.

Further, the light source 102 may provide the source beam 104 using any technique. For example, the light source 102 may provide the source beam 104 through an optical fiber. By way of another example, the light source 102 may provide the source beam 104 as a free-space beam.

The light source 102 may provide a source beam 104 having any wavelength or range of wavelengths. Further, the spectrum of the source beam 104 may be selected based on optical properties (e.g., absorption, reflectivity, transmittivity, or the like) of a sample to be characterized. It is further recognized herein that the spectral width of the source beam 104 may be inversely related to the temporal coherence length such that increasing the spectral width of the source beam 104 may decrease the temporal coherence length and vice versa.

In one embodiment, the sample thickness gauge 100 includes two or more light sources 102 having different spectra that may be selectively utilized. In another embodiment, the light source 102 may include a tunable light source 102 to provide a source beam 104 having tunable spectrum. In another embodiment, the sample thickness gauge 100 includes one or more spectral filters (e.g., tunable spectral filters, a series of selectable fixed spectral filters, or the like) to control the spectrum of the source beam 104.

The interferometers 108 may include any type of interferometers known in the art suitable for generating interference fringes between the test sample 110 and the reference sample 112 including, but not limited to, a Michelson interferometer or a Linnik interferometer. Further, the interferometers 108 may project or focus the source beam 104 on the test sample 110 or the reference sample 112 to any desired spot size.

In one embodiment, each interferometer 108 includes a beamsplitter 130 configured to split the respective source beam 104 into two arms, with a sample arm 132 (e.g., sample arms 132a, 132b) including the test sample 110 and a reference arm 134 (e.g., reference arms 134a, 134b) directed to the reference sample 112. In another embodiment, each interferometer 108 includes a detector 136 configured to receive the combined reflected signal from the two arms. In this regard, the intensity of light on the detector 136 may vary based on interference between the test surface 114 and the reference surface 116.

Each interferometer 108 may include any type of detector 136 known in the art. In one embodiment, the detector 136 may include at least one single-pixel detector such as, but not limited to, a photodiode, an avalanche photodiode, or the like. In another embodiment, the detector 136 may include at least one multi-pixel detector such as, but not limited to, a complementary metal-oxide-semiconductor (CMOS) device or a charge-coupled device (CCD). In this regard, the detector 136 may generate a two-dimensional interferogram associated with an extended illuminated region of the test sample 110 in which the intensity of light at each pixel corresponds to a different portion of the test sample 110. Further, two-dimensional interferograms may be used to determine thickness variations of the test sample 110 across the extended illuminated region.

In another embodiment, each detector 136 is connected to the controller 122 (e.g., the analog to digital converter 128 of the controller 122) such that the controller 122 may receive signals generated by the detector 136.

The sample thickness gauge 100 may further include one or more additional optical components to direct and/or modify the source beam 104 such as, but not limited to, turning mirrors (e.g., mirrors 138), lenses, intensity filters, or spectral filters.

FIG. 1B is a conceptual view of the sample thickness gauge 100 arranged to focus the source beam 104 to a diffraction-limited spot size on the test sample 110 and the reference sample 112, in accordance with one or more embodiments of the present disclosure. In this regard, the sample thickness gauge 100 may determine a thickness of the test sample 110 at a localized point 140.

In one embodiment, the sample thickness gauge 100 includes a fiber-based light source 102 coupled to a fiber-based source beam splitter 106. In this regard, each interferometer 108 may receive a portion of the source beam 104 through a fiber 142.

In another embodiment, the source beam 104 from the fiber 142 is split by the beamsplitter 130 into a sample arm 132 and a reference arm 134.

In another embodiment, at least one interferometer 108 includes one or more focusing elements 144 (e.g., lenses, curved mirrors, or the like) to collect the source beam 104 from the fiber 142 and direct the source beam 104 to the test sample 110 and the reference sample 112. Further, the one or more focusing elements 144 may be located prior to the beamsplitter 130, in the sample arm 132, in the reference arm 134, or any combination thereof.

In one embodiment, as illustrated in FIG. 1B, the focusing elements 144 focus the source beam 104 onto the test sample 110 and the reference sample 112 (e.g., to a diffraction-limited spot). In another embodiment, though not shown, the focusing elements 144 collimate the source beam 104 to illuminate extended regions of the test sample 110 and the reference sample 112.

It is recognized herein that focusing the source beam 104 on the test sample 110 and reference sample 112 may provide greater tolerance for mis-leveling of the test sample 110 or the reference sample 112 relative to illuminating extended areas, whereas extended illumination with the source beam 104 may provide extended thickness measurements in a single shot (e.g., to measure variations of the test sample 110, fabricated features on the test sample 110, or the like). In another embodiment, the focusing elements 144 are adjustable or removable such that the focusing conditions may be adjusted or otherwise selected. For example, an interferometer 108 may include removable objective lenses to selectively switch between focused and extended illumination. By way of another example, an interferometer 108 may include adjustable lenses (e.g., lenses having adjustable powers, lenses on translation stages, or the like) to selectively switch between focused and extended illumination.

In another embodiment, at least one interferometer 108 includes one or more optical condensers 146 to direct and/or focus combined light from the test sample 110 and the reference sample 112 to the detector 136.

Further, it is not necessarily the case that the first and second interferometers 108a, 108b have the same components in the respective arms as illustrated in FIGS. 1A and 1B. FIG. 1C is a conceptual view illustrating a sample thickness gauge 100 including a mirror 148 in a reference arm 134 but not in the sample arm 132 of the first interferometer 108a, but including a mirror 148 in a sample arm 132 but not in the second interferometer 108b, in accordance with one or more embodiments of the present disclosure. In the configuration of the sample thickness gauge 100 illustrated in FIG. 1C, a portion of the source beam 104 in the reference arm 134 propagates through the beamsplitter 130 and is incident on the reference surface 116, whereas a portion of the source beam 104 in the sample arm 132 is reflected by the beamsplitter 130 and directed to the test sample 110 by a mirror 148.

Figure 2A:
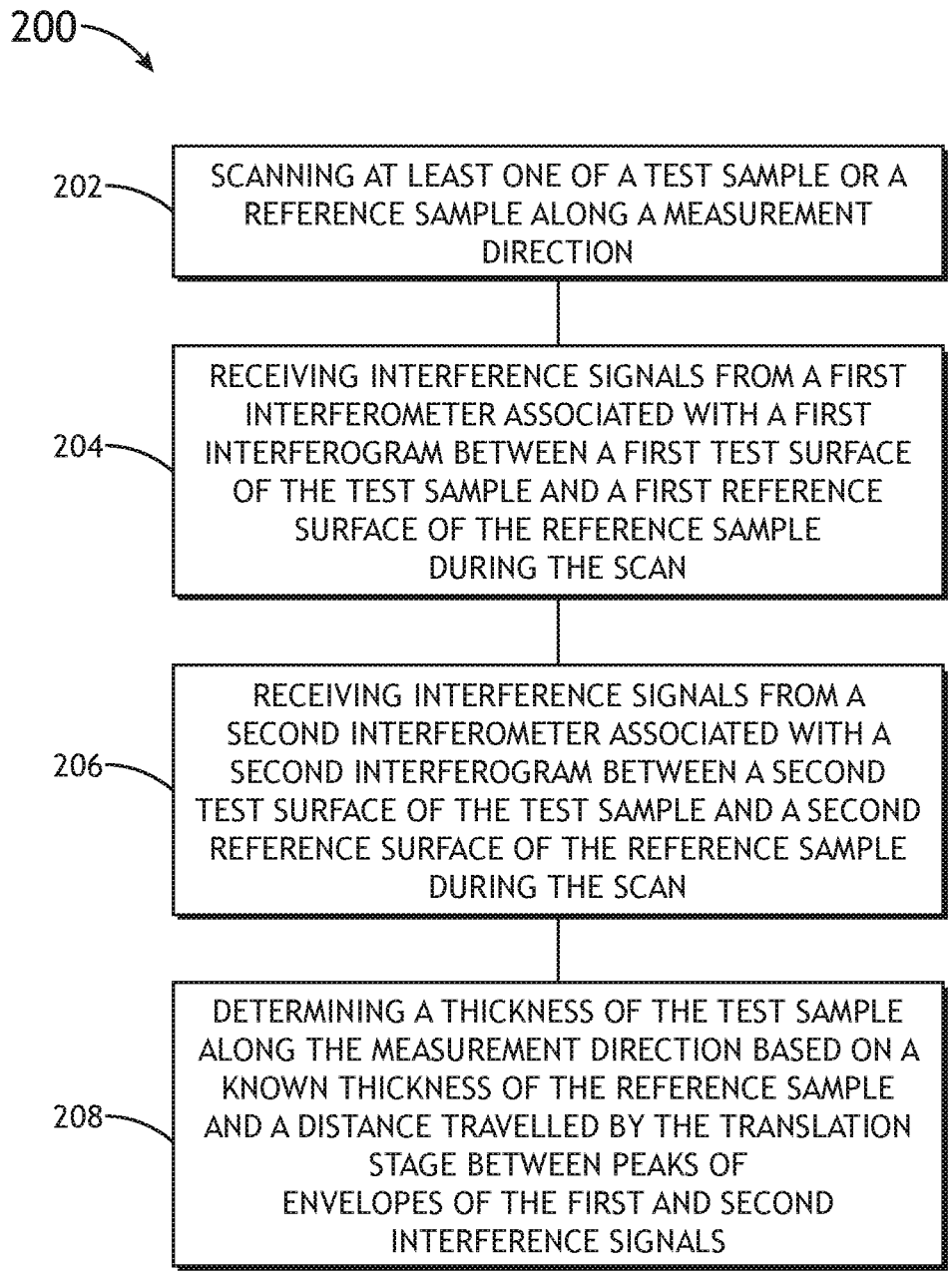
FIG. 2A is a flow diagram illustrating steps performed in a method for measuring thickness based on dual interferometry, in accordance with one or more embodiments of the present disclosure.
Figure 2B:
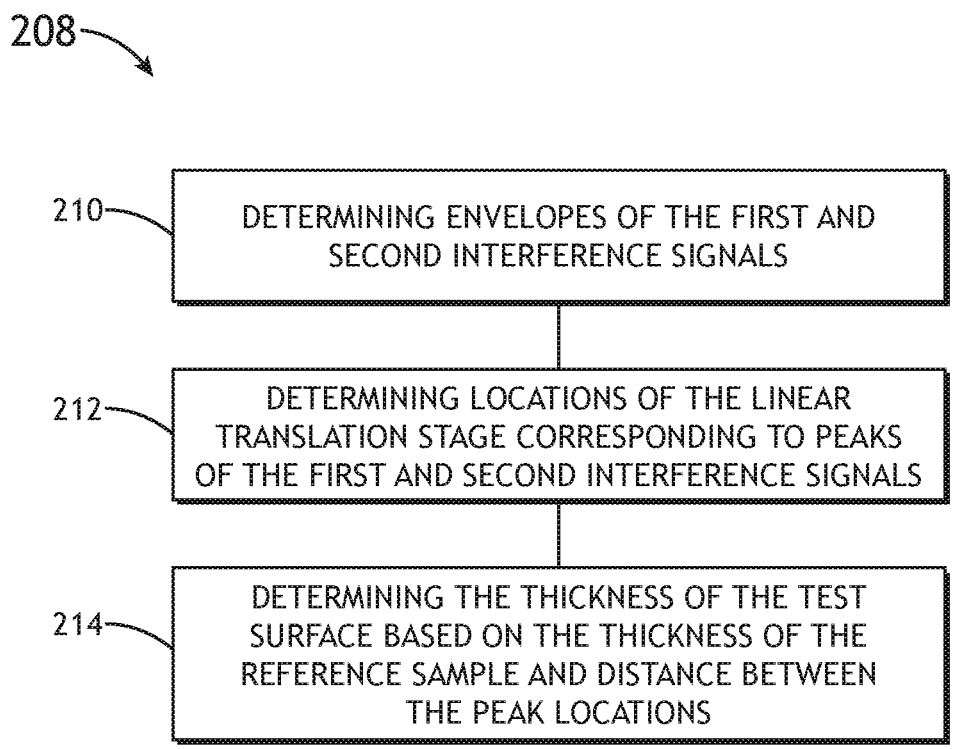
FIG. 2B is a flow diagram illustrating sub-steps for determining the thickness of the test sample based on the peak separation distance and the thickness of the reference sample, in accordance with one or more embodiments of the present disclosure.
Figure 2C:
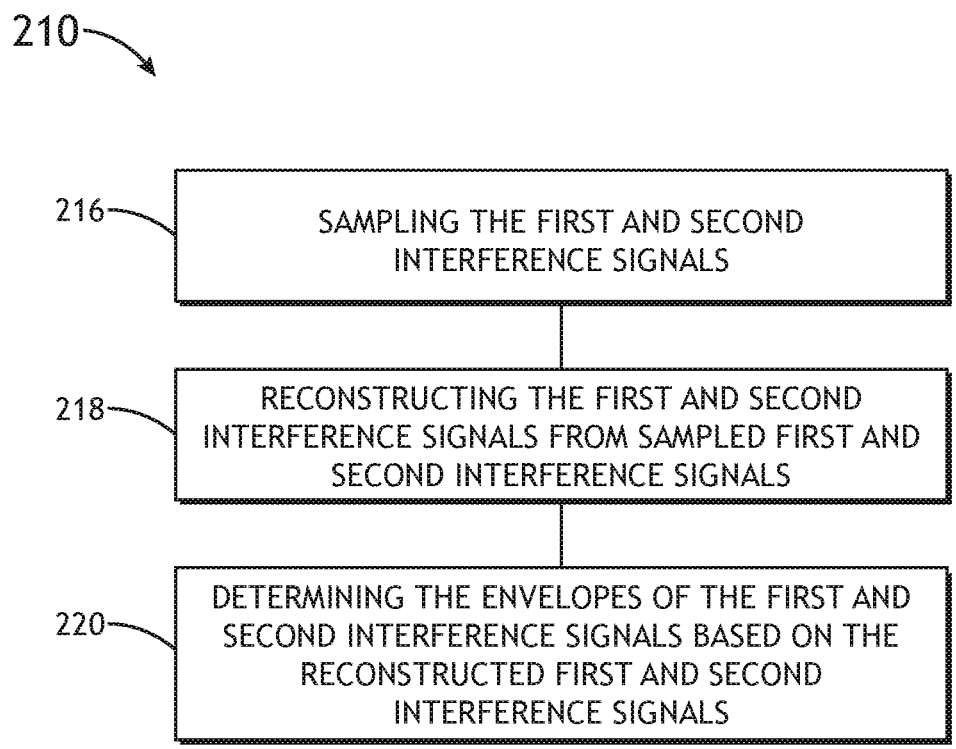
FIG. 2C is a flow diagram illustrating sub-steps for determining envelopes of the first and second interference signals using digital signal processing techniques, in accordance with one or more embodiments of the present disclosure.

Referring now to FIGS. 2A through 2C, various steps for measuring thickness based on dual interferometry is described in greater detail.

FIG. 2A is a flow diagram illustrating steps performed in a method 200 for measuring thickness based on dual interferometry, in accordance with one or more embodiments of the present disclosure. Applicant notes that the embodiments and enabling technologies described previously herein in the context of the sample thickness gauge 100 should be interpreted to extend to the method 200. It is further noted, however, that the method 200 is not limited to the architecture of the sample thickness gauge 100.

In one embodiment, the method 200 includes a step 202 of scanning at least one of the test sample 110 or the reference sample 112 along a measurement direction 120. In another embodiment, the method 200 includes a step 204 of receiving interference signals from a first interferometer 108a associated with a first interferogram between a first test surface 114a of the test sample 110 and a first reference surface 116a of the reference sample 112 during the scan. In another embodiment, the method 200 includes a step 206 of receiving interference signals from a second interferometer 108b associated with a second interferogram between a second test surface 114b of the test sample 110 and a second reference surface 116b of the reference sample 112 during the scan. In another embodiment, the method 200 includes a step 208 of determining a thickness of the test sample 110 along the measurement direction 120 based on a known thickness of the reference sample 112 and a distance travelled by the translation stage between peaks of envelopes of the first and second interference signals.

As described previously herein, a signal strength of interference fringes between the test sample 110 and the reference sample 112 in each of the interferometers 108 will peak when arms of the interferometers 108 have equal lengths. Further, the signal strength of the interference fringes will drop off as the optical path length difference between the arms of the interferometers 108 exceeds the temporal coherence length of the source beam 104. Accordingly, scanning the reference sample 112 may simultaneously generate interference fringes from the first interferometer 108a that peak when the optical path length difference between the first test surface 114a and the first reference surface 116a is zero and interference fringes from the second interferometer 108b that peak when the optical path length difference between the second test surface 114b and the second reference surface 116b is zero. If the thickness of the reference sample 112 is known, the thickness of the test sample 110 may be determined based on the known thickness and the difference between the peak locations associated with the signals from the first interferometer 108a and the second interferometer 108b.

For example, the determination of the thickness of the test sample 110 (e.g., in step 208) using the first interferometer 108a in FIG. 1C may be described by the following equations. However, it is to be understood that the configuration of the first interferometer 108a illustrated in FIG. 1C as well the corresponding equations below are provided solely for illustrative purposes and should not be interpreted as limiting. Rather, similar formulations may be generated for additional configurations of an interferometer 108 (e.g., the second interferometer 108b in FIG. 1C, the interferometers 108 in FIG. 1B, or any alternative configuration).

The electric field of light reflected from the test sample 110 ($E_S$) and from the reference sample 112 ($E_R$) projected to the detector 136 may be described as:

$$E_S(\omega) = t_{BS} r_{BS} r_s E_0(\omega) \exp\left[-j\left(2\frac{\omega}{c} z_S + \phi_S\right)\right], \text{ and} \quad (1)$$

$$E_R(\omega) = t_{BS} r_{BS} r_M^2 r_R E_0(\omega) \exp\left[-j\left(2\frac{\omega}{c} z_R + \phi_R\right)\right], \quad (2)$$

where $t_{BS}$ and $r_{BS}$ are the transmission and reflection coefficients of the beamsplitter 130, $r_S$ is the reflection coefficient of the test sample 110, $r_R$ is the reflection coefficient of the reference sample 112, $r_M$ is the reflection coefficient of the mirror 148, $\omega$ is the spectral frequency of the source beam 104, c is the speed of light, $z_S$ is the free-space length of the sample arm 132a of the first interferometer 108a, $z_R$ is the free-space length of the reference arm 134a of the first interferometer 108a, $\phi_S$ is the phase generated by any optical components in the sample arm 132a, $\phi_R$ is the phase generated by any optical components in the reference arm 134a, and $E_0(\omega)$ describes the shape of the source beam 104.

The intensity of light ($I(\omega)$) on the detector 136 may then be:

$$I(\omega) = R \cdot [\|E_S(\omega)\| + \|E_R(\omega)\| + 2\Re[E_S(\omega) E_R(\omega)^*]], \quad (3)$$

where R is the responsivity of the detector 136.

In a nonlimiting example of a Gaussian source beam 104, the intensity of light on the detector 136 ($I(\omega)$) may be written as:

$$I(\omega) = R \cdot |E_0(\omega)^2| \cdot \alpha \left\{ 1 + \beta \cos\left[2\frac{\omega}{c}(z_R - z_S) + \Delta\phi_{R,S}\right] \right\}, \quad (4)$$

with $$|E_0(\omega)|^2 = I_0(\omega) = \frac{A_0}{\sigma_\omega \sqrt{2\pi}} \exp\left[\frac{-(\omega - \omega_C)^2}{2\sigma_\omega^2}\right], \quad (5)$$

$$\alpha = t_{BS}^2 r_{BS}^2 (r_S^2 + 4 r_M^4 r_R^4), \text{ and} \quad (6)$$

$$\beta = 2 \frac{r_M^2 r_R r_S}{(r_S^2 + r_M^4 r_R^2)}, \quad (7)$$

where $A_0$ is the maximum spectral intensity, $\omega_c$ is the peak frequency, and $\sigma_\omega$ is the standard deviation of the spectrum of the of the source beam 104, respectively.

The overall intensity on the detector 136 may then be obtained by integrating the intensity $I(\omega)$ over time:

$$I_t = \int_{-\infty}^{\infty} I(\omega) d\omega \quad (8)$$
$$= \gamma \left\{ 1 + \beta \exp\left[-\frac{8\pi^2 \sigma_\lambda^2}{\lambda_0^4}(z_R - z_S + d_{\it eff})^2\right] \cdot \cos\left[4\pi \frac{(z_R - z_S + d_{\it eff})}{\lambda_0}\right] \right\},$$

where $$\gamma = A_0 \alpha R, \quad (9)$$

$$\lambda_0 = 2\pi \frac{2}{\omega_c}, \quad (10)$$

$$\sigma_\omega^2 = 2\pi c \frac{\sigma_\lambda^2}{\lambda_0^2}, \quad (11)$$

and $d_{\it eff}$ is a constant path length related to the optical components in the arms of the interferometer 108.

The result of this model is that each interferometer 108 (e.g., interferometers 108a, 108b) generates an interference signal during the scan with a shape of a raised cosine with a Gaussian envelope. Further, the peak of the Gaussian envelope for each interferometer 108 corresponds to the condition $$z_R - z_S + d_{\it eff} = 0, \quad (12)$$

based on Equation (8), which corresponds to the position at which the path lengths of the sample arm 132a and the reference arm 134a are matched for that interferometer 108.

As a result, the thickness of the test sample 110 may be related to the distance between the peaks of the interference signals from the two interferometers 108 (e.g., the peak separation distance) and the thickness of the reference sample 112.

However, it is to be understood that the equations above associated with a Gaussian beam are provided solely for illustrative purposes and should not be interpreted as limiting. Similar equations may be formulated for beams having different profiles.

Figure 3:
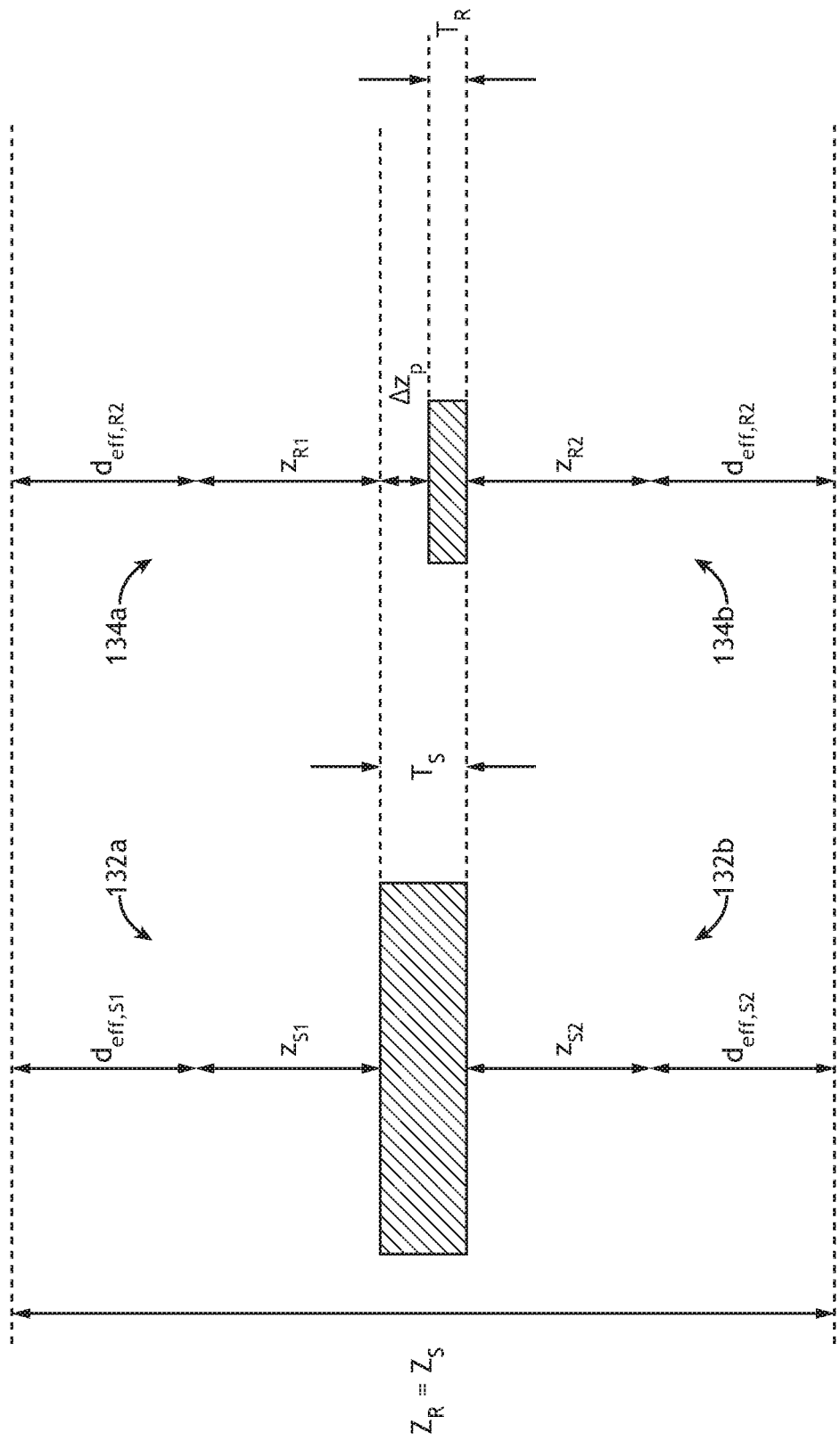
FIG. 3 is a conceptual view of the sample arm and reference arm of each interferometer, in accordance with one or more embodiments of the present disclosure.

FIG. 3 is a conceptual view of the sample arm 132 and reference arm 134 of each interferometer 108, in accordance with one or more embodiments of the present disclosure. It is noted that FIG. 3 may apply regardless of the particular optical components in each arm of an interferometer 108. As illustrated in FIG. 3, the combined path of the sample arm 132 of the first interferometer 108a, the sample arm 132 of the second interferometer 108b, and the thickness ($T_S$) of the test sample 110 is equal to the combined path of the reference arm 134 of the first interferometer 108a, the reference arm 134 of the second interferometer 108b, and the thickness ($T_R$) of the reference sample 112. In this regard, $Z_R = Z_S$ in FIG. 3.

Further, FIG. 3 illustrates a position of the reference sample 112 at which the path lengths of the second interferometer 108b incorporating the second test surface 114b and the second reference surface 116b are equal. In particular, the path lengths of the second interferometer 108b satisfy the following condition at this location:

$$z_{R2} - z_{S2} + d_{\it eff,2} = z_{R2} - z_{S2} + (d_{\it eff,R2} - d_{\it eff,S2}) = 0. \quad (13)$$

which corresponds to a peak of the interference signal from the second interferometer 108b based on Equations (8) and (12) above.

Similarly, translating the reference sample 112 by a distance of $\Delta z_p$ (e.g., the peak separation distance) makes the path lengths of the first interferometer 108a incorporating the first test surface 114a and the first reference surface 116a equal. At this position (not shown), path lengths of the first interferometer 108a satisfy the following condition:

$$z_{R1} - z_{S1} + d_{\it eff,1} = z_{R1} - z_{S1} + (d_{\it eff,R1} - d_{\it eff,S1}) = 0, \quad (14)$$

which corresponds to a peak of the interference signal from the first interferometer 108a based on Equations (8) and (12) above.

Once determined, the peak separation distance $\Delta z_p$ may be related to the thickness ($T_S$) of the test surface 114. For example, given that $Z_R = Z_S$:

$$d_{\it eff,R1} + z_{R1} + \Delta z_p + T_R + z_{R2} + d_{\it eff,R2} = d_{\it eff,S1} + z_{S1} + T_S + z_{S2} + d_{\it eff,S2}, \quad (15)$$

which simplifies to:

$$T_S = \Delta z_p + T_R. \quad (16)$$

Steps for determining the peak separation distance $\Delta z_p$ will now be described in greater detail.

FIG. 2B is a flow diagram illustrating sub-steps for determining the thickness ($T_S$) of the test sample 110 based on the peak separation distance $\Delta z_p$ and the thickness ($T_R$) of the reference sample 112 (e.g., associated with step 208), in accordance with one or more embodiments of the present disclosure.

It is recognized herein that while the peak of an interference signal during a scan of the linear translation stage 118 may theoretically occur when the sample arm 132 and the reference arm 134 of an associated interferometer 108 are matched, the sampling resolution, noise, or other fluctuations may result in a difference between a location of the linear translation stage 118 associated with a peak detected value (e.g., a sampled value) and the location where the sample arm 132 and the reference arm 134 are matched. Accordingly, it may be desirable to apply one or more signal processing techniques to provide an accurate and robust technique for determining the peak locations of the first and second interference signals.

In one embodiment, the step 208 includes the step 210 of determining envelopes of the first and second interference signals. In another embodiment, the step 208 includes the step 212 of determining locations of the linear translation stage 118 corresponding to peaks of the first and second interference signals (e.g., peak locations). In another embodiment, the step 208 includes the step 214 of determining the thickness ($T_S$) of the test surface 114 based on the thickness ($T_R$) of the reference sample 112 and a distance between the peak locations ($\Delta z_p$). For example, Equation

(16) above may be used to determine the thickness ($T_S$) of the test surface 114 based on the thickness ($T_R$) of the reference sample 112 and distance between the peak locations ($\Delta z_p$).

It may be the case that determining a peak location of a relatively slow-varying envelope function of the interference fringes may be determined with a greater degree of accuracy and/or reliability than determining a peak location of the first and second interference signals directly. Further, as will be discussed in greater detail below, in the case that the interference signals are sampled, it may be the case at least one of the interference signals are not sampled at the precise location of the linear translation stage 118 at which the arms of the associated interferometer 108 are matched.

Envelope functions associated with the first and second interference signals (e.g., step 210) may be determined using any technique in the art. Further, the step 208 and any of the associated sub-steps above (e.g., steps 210-214) may be implemented using any combination of analog or digital processing techniques. For example, envelope functions associated with the first and second interference signals (e.g., step 210) may be determined by applying a low-pass filter (either digital or analog) to the first and second interference signals to remove the high-frequency oscillations associated with interference.

FIG. 2C is a flow diagram illustrating sub-steps for determining envelopes of the first and second interference signals using digital signal processing techniques, in accordance with one or more embodiments of the present disclosure. In one embodiment, the step 210 includes the step 216 of sampling the first and second interference signals (e.g. using an analog to digital converter 128). For example, it may be the case that the first and second interference signals generated by the detectors 136 during a scan are analog signals. Accordingly, sampling the interference signals may enable the use of digital signal processing techniques for determining the envelopes of the first and second interference signals.

The first and second interference signals may be sampled using any technique known in the art. For example, the first and second interference signals may be sampled at regular location intervals based on a hardware position trigger from the linear translation stage 118. By way of another example, the first and second interference signals may be sampled at regular time intervals based on a clock signal.

In one embodiment, the step 210 includes the step 218 of reconstructing the first and second interference signals from sampled first and second interference signals and the step 220 of determining the envelopes of the first and second interference signals based on the reconstructed first and second interference signals. Reconstructed signals may be generated (e.g., in step 218) using any technique known in the art. For example, sampled interference signals may be reconstructed using one or more interpolation techniques (e.g., polynomial interpolation, spline interpolation, or the like) such that unsampled data between the sample datapoints may be estimated. By way of another example, sampled interference signals may be fit to one or more functions derived from theory and/or simulations using one or more curve-fitting techniques (e.g., regression, or the like). For instance, sampled interference signals may be fit based on Equations (4)-(7) above. Further, one or more smoothing operations may be applied to the reconstructed interference signals. Similarly, any combination of interpolation, curve fitting, smoothing techniques, or the like may be applied to envelope signals generated based on reconstructed interference signals (e.g., in step 220). For example, envelope signals generated based on reconstructed interference signals may be further processed to mitigate noise or other fluctuations in the envelope to facilitate the determination of the peak location corresponding to the location of the linear translation stage 118 at which the sample arm 132 and the reference arm 134 of a given interferometer 108 are matched.

Figure 4A:
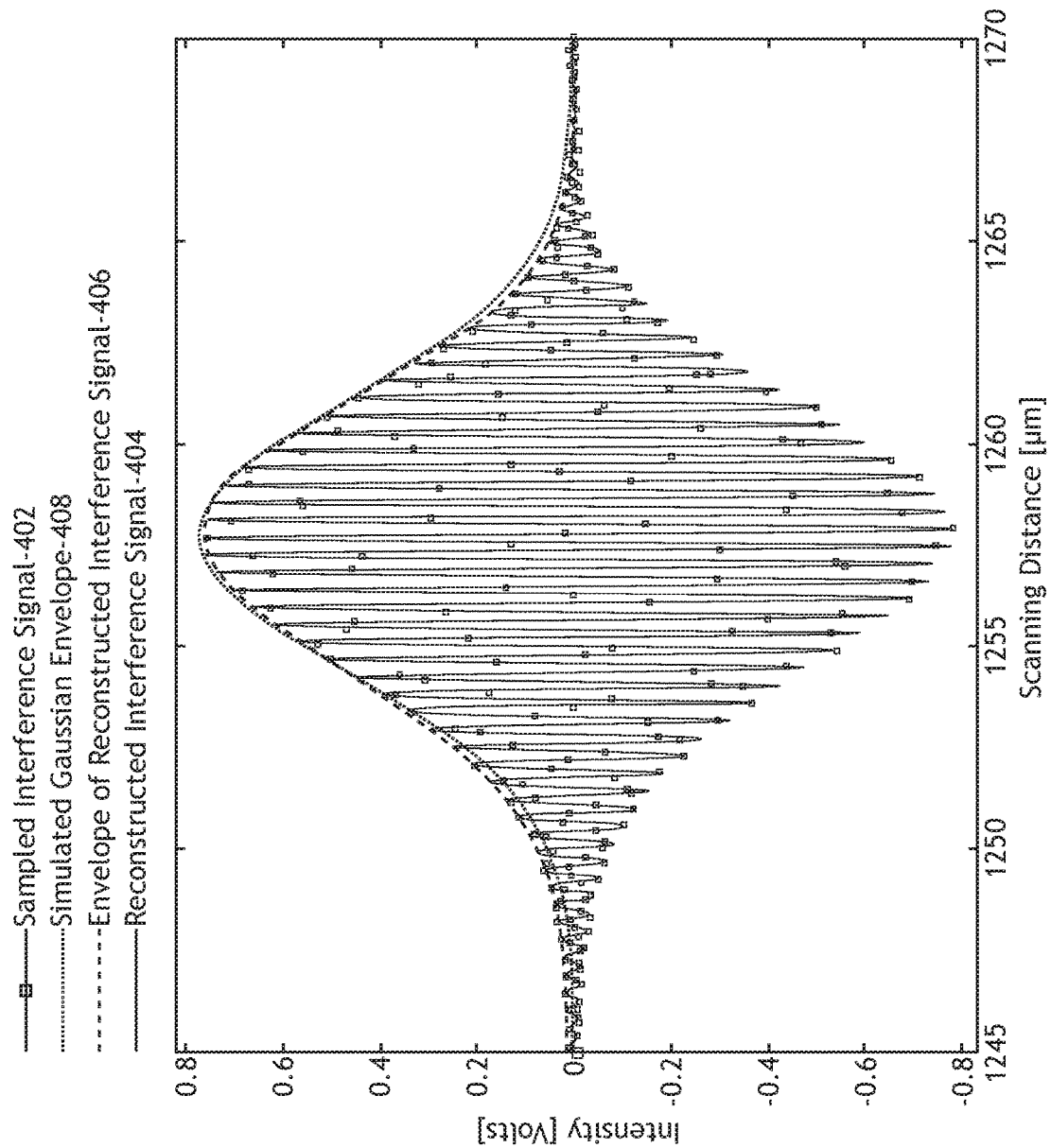
FIG. 4A is a plot of a sampled interference signal, a reconstructed interference signal, an envelope of the reconstructed interference signal, and a simulated Gaussian envelope, in accordance with one or more embodiments of the present disclosure.

FIG. 4A is a plot of a sampled interference signal 402, a reconstructed interference signal 404, an envelope of the reconstructed interference signal 406, and a simulated Gaussian envelope 408, in accordance with one or more embodiments of the present disclosure. For example, the sampled interference signal 402 of FIG. 4A has a sampling resolution of 100 nm and the reconstructed interference signal 404 is generated with a 10 nm resolution.

It is recognized herein that the accuracy of an envelope generated from sampled data as opposed to theoretical (or analog) data may generally depend on the extent to which sampled points track the contours of the theoretical data. As illustrated in FIG. 4A, the sampled interference signal 402 may not include sampled points at the peaks of the interference fringes such that an envelope function based solely on the sampled interference signal 402 may include significant errors. In contrast, the reconstructed interference signal 404 is generated with sufficient resolution to provide data at peaks of the interference fringes. Accordingly, the envelope of the reconstructed interference signal 406, corresponding to an envelope generated based on the sampled interference signal 402 closely tracks the peaks of the interference fringes. Further, the envelope of the reconstructed interference signal 406 provides excellent agreement with a simulated Gaussian envelope 408 (e.g., based Equations (1)-(11) above).

Figure 4B:
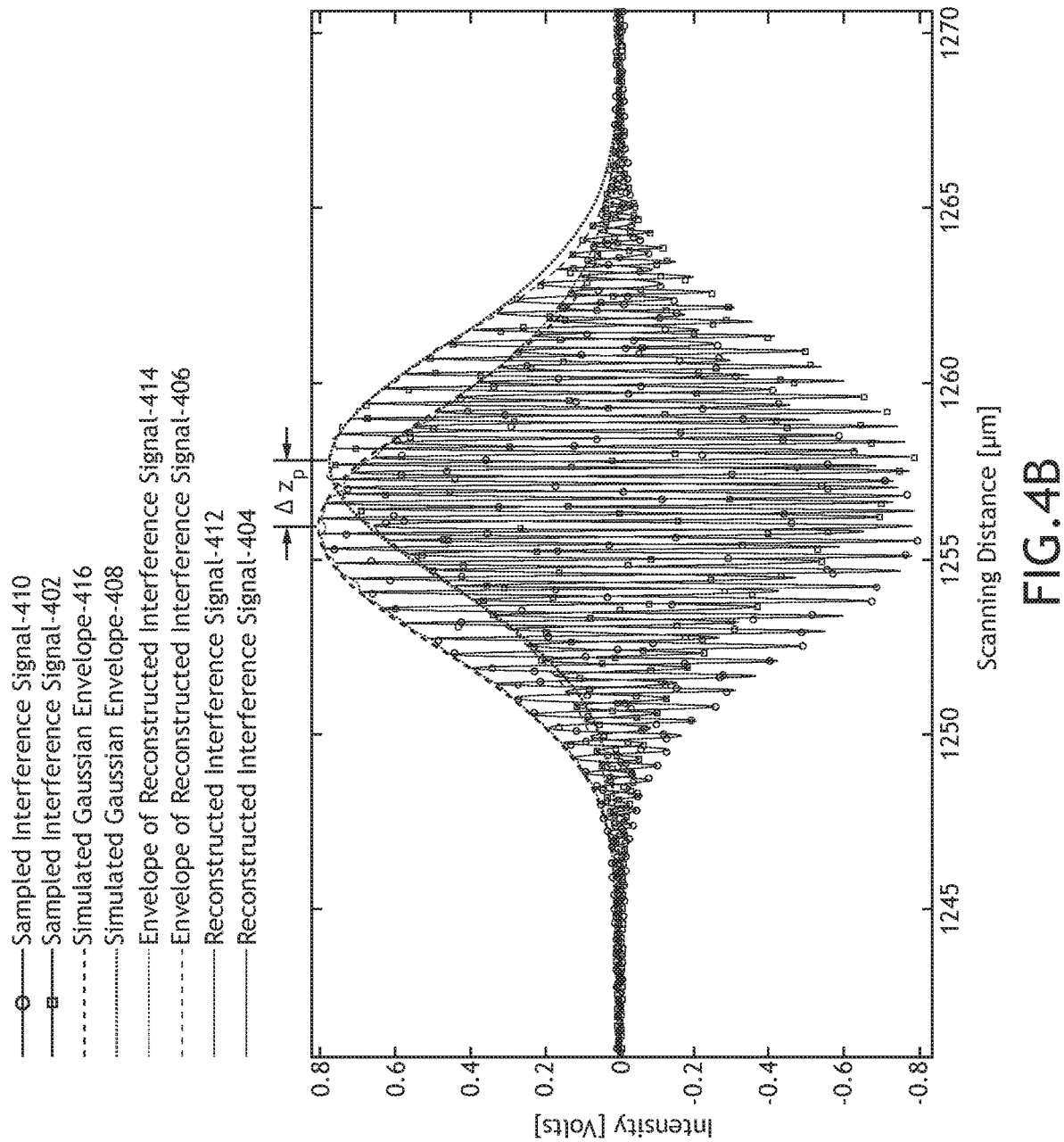
FIG. 4B is a plot of sampled first and second interference signals, reconstructed first and second interference signals, envelopes of the first and second reconstructed signals, and Gaussian envelopes for the first and second interference fringes associated with the first and second interferometers, in accordance with one or more embodiments of the present disclosure.

FIG. 4B is a plot of sampled first and second interference signals, reconstructed first and second interference signals, envelopes of the first and second reconstructed signals, and Gaussian envelopes for the first and second interference fringes associated with the first and second interferometers 108a, 108b, in accordance with one or more embodiments of the present disclosure.

In particular, the rightmost set of signals is generated by the second interferometer 108b and corresponds to the plot in FIG. 4A, while the leftmost set of signals is generated by the first interferometer 108a and includes a sampled interference signal 410, a reconstructed interference signal 412, an envelope of the reconstructed interference signal 414, and a simulated Gaussian envelope 416.

The peak separation distance ($\Delta z_p$) may thus be determined based on a difference between the peak locations of the envelopes of the first and second reconstructed interference signals 406, 414. Further, the locations of the peaks (e.g., in step 212) as well as the peak separation distance ($\Delta z_p$) may be determined using any technique known in the art. In one embodiment, a peak location for an interference signal may be determined by identifying a location corresponding to zero phase of the interference signals (e.g., the first or second interference signals) in the vicinity of a peak. For example, the method 200 may include obtaining phases of the first and second interference signals in vicinities around the peaks and identifying the peak locations as locations where the phases of the first and second interference signals are zero.

Referring again to FIGS. 2A through 2C, the method 200 may include one or more verification steps. For example, the method 200 may include a signal strength verification step to ensure that signal strength on at least one detector 136 is above a selected threshold. In the case that the signal strength is not above the selected threshold the method 200 may further include one or more corrective steps. For instance, the method 200 may include increasing a power of the source beam 104. In another instance, the method 200 may include modifying the spectrum (e.g., operating band) of the source beam 104. In this regard, the spectrum of the source beam 104 may be tuned to include wavelengths suitable for providing increased signal strength such as, but not limited to, wavelengths at which the test sample 110 has a higher reflectivity. By way of another example, the method 200 may include verifying the shape and/or fit of an envelope of an interference signal (e.g., in step 210) for either interferometer 108. For instance, the method 200 may include that an envelope function fits a Gaussian distribution within a selected tolerance. In the case that the shape and/or fit is not within a selected tolerance, the method 200 may include one or more corrective steps such as, but not limited to, repeating a measurement after modifying the intensity and/or spectrum of the source beam 104, or applying a different technique to determine the peak separation distance ($\Delta z\_p$).

Figure 5:
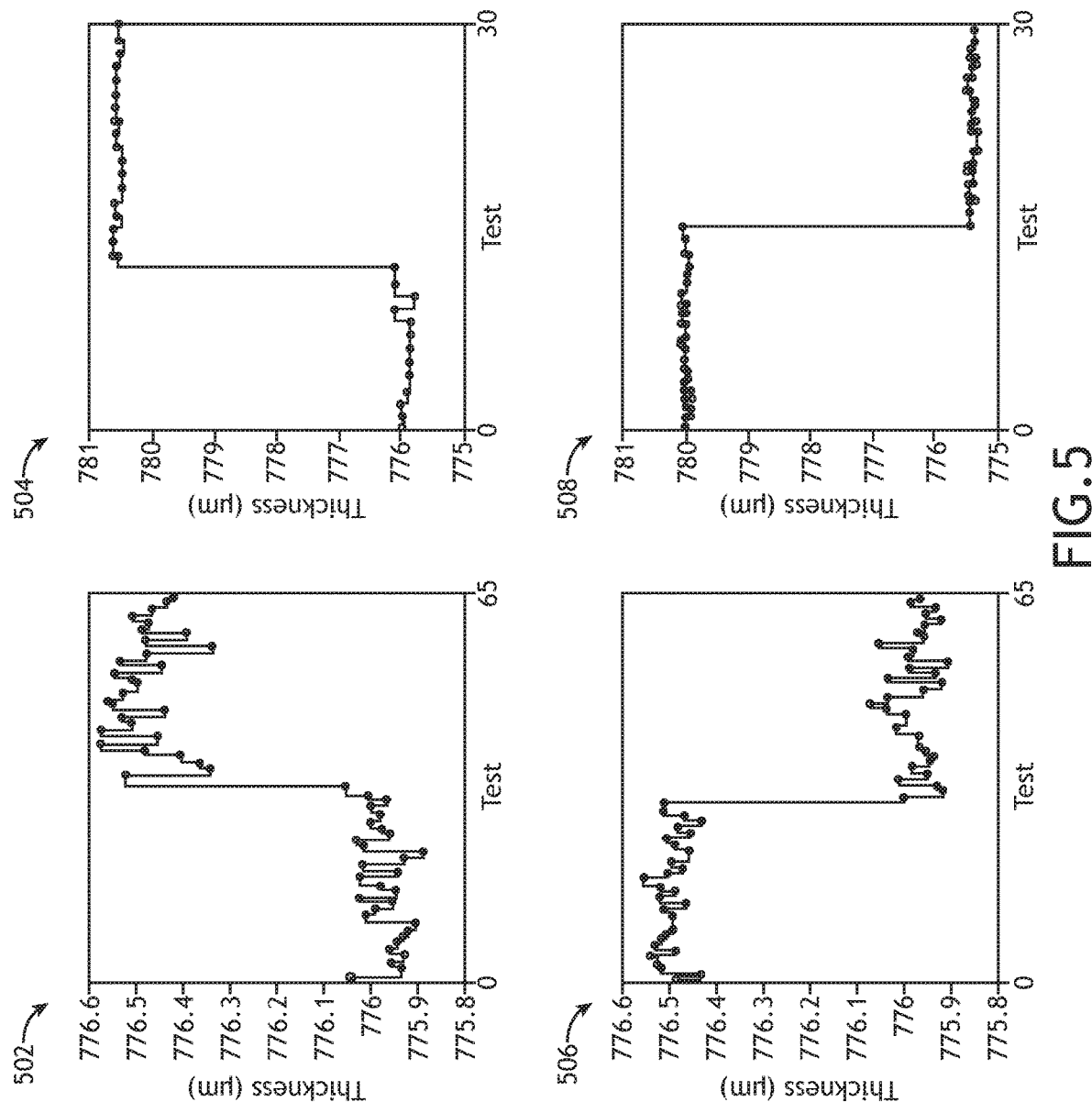
FIG. 5 includes spatially-resolved dual interferometry thickness measurements of samples having step features with heights verified by atomic force microscopy, in accordance with one or more embodiments of the present disclosure.

Referring now to FIG. 5, dual interferometry thickness measurements described herein may measure thickness variations at multiple locations of a sample. FIG. 5 includes spatially-resolved dual interferometry thickness measurements of samples having step features with heights verified by atomic force microscopy, in accordance with one or more embodiments of the present disclosure. In particular, plot 502 includes a measurement of a sample with a known step size of 517 nm as 500 nm, plot 504 includes a measurement of a sample with a known step size of 4.7 µm as 4.6 µm, plot 506 includes a measurement of a sample with a known step size of 0.98 µm as 1.0 µm, and plot 508 includes a measurement of a sample with a known step size of 9.4 µm as 9.3 µm.

As described previously herein, dual interferometry thickness measurements as described herein may provide spatially-resolved thickness measurements through various techniques. By way of another example, dual interferometry with a spatially-extended beam coupled with a multi-pixel detector may simultaneously provide thickness measurements for multiple locations on the sample within the extended area.

Figure 6:
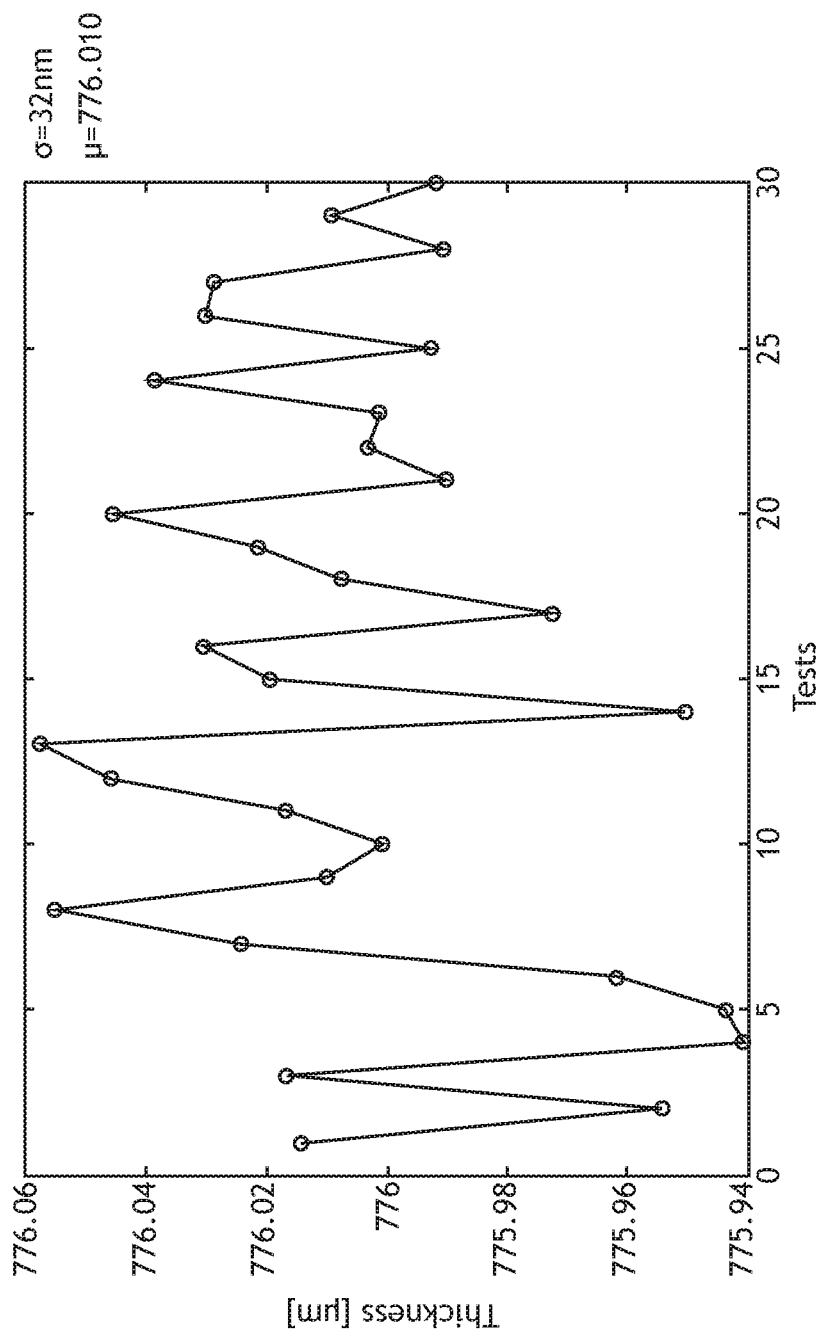
FIG. 6 is a plot illustrating 30 repeated measurements of a 300 mm sample wafer having a nominal thickness of 776 μm, in accordance with one or more embodiments of the present disclosure.

Referring now to FIG. 6, dual interferometry may provide highly repeatable measurements with short measurement times. FIG. 6 is a plot illustrating 30 repeated measurements of a 300 mm sample wafer having a nominal thickness of 776 µm, in accordance with one or more embodiments of the present disclosure. As illustrated in FIG. 6, the repeated measurements exhibit an average thickness value of 776.010 µm with a standard deviation of 32 nm.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system comprising:
   a controller communicatively coupled to a first interferometer and a second interferometer, the controller including one or more processors configured to execute program instructions causing the one or more processors to:
   receive a first interference signal from the first interferometer, wherein the first interferometer generates a first interferogram between a first surface of a test sample and a first surface of a reference sample having a known thickness with a first illumination beam as at least one of the test sample or the reference sample is scanned along a measurement direction, the first illumination beam including a first portion of an illumination beam from a beamsplitter;
   receive a second interference signal from the second interferometer, wherein the second interferometer generates a second interferogram between a second surface of the test sample and a second surface of the reference sample with a second illumination beam, the second illumination beam including a second portion of the illumination beam from the beamsplitter; and
   determine a thickness of the test sample along the measurement direction based on the thickness of the reference sample and a distance travelled by a translation stage between peaks of envelopes of the first and second interference signals.

2. The system of claim 1, wherein widths of the envelopes of the first and second interference signals are associated with a temporal coherence length of the illumination from the illumination source.

3. The system of claim 1, wherein the first and second interferometers focus the first and second illumination beams to opposing points of the first and second surfaces of the test sample, wherein the thickness of the test sample along the measurement direction includes a single thickness measurement between the opposing points.

4. The system of claim 3, wherein the first and second interferometers include single-pixel detectors.

5. The system of claim 1, wherein the first and second interferometers direct the first and second illumination beams as collimated beams to opposing regions of the first and second surfaces of the test sample, wherein the thickness of the test sample along the measurement direction is associated with a plurality of thickness measurements between the opposing regions.

6. The system of claim 5, wherein the first and second interferometers include multi-pixel detectors, wherein the first and second interference signals each include a plurality of signals associated with a plurality of opposing points on the first and second surfaces of the test sample within the opposing regions.

7. The system of claim 1, wherein the illumination source comprises:
a broadband laser source.

8. The system of claim 1, wherein the illumination source comprises:
a light-emitting diode (LED).

9. The system of claim 8, wherein the LED comprises:
a super-luminescent LED.

10. The system of claim 1, wherein the controller samples the first and second interference signals at selected intervals to create sampled first and second interference signals.

11. The system of claim 10, wherein the controller includes an analog to digital converter to sample the first and second interference signals.

12. The system of claim 11, wherein the analog to digital converter samples the first and second interference signals upon receiving hardware position triggers at the selected intervals from the translation stage scanning the at least one of the test sample or the reference sample.

13. The system of claim 10, wherein determining a thickness of the test sample along the measurement direction based on the thickness of the reference sample and a distance between peaks of envelopes of the first and second interference signals comprises:
reconstructing the first and second interference signals from the sampled first and second interference signals;
determining the envelopes of the first and second interference signals based on the reconstructed first and second interference signals;
determining peak locations of the first and second interference signals; and
determining the distance between the peaks of the envelopes of the first and second interference signals based on the peak locations.

14. The system of claim 13, wherein determining locations of the translation stage at the peaks of the first and second interference signals comprises:
obtaining phases of the first and second interference signals in vicinities around the peaks; and
identifying the peak locations as locations where the phases of the first and second interference signals are zero.

15. A system comprising:
an illumination source;
a beam splitter configured to split illumination from the illumination source into a first illumination beam and a second illumination beam;
a translation stage configured to linearly translate a reference sample along a measurement direction, the reference sample having a known thickness;
a first interferometer configured to generate a first interferogram between a first surface of a test sample and a first surface of the reference sample with the first illumination beam;
a second interferometer configured to generate a second interferogram between a second surface of the test sample and a second surface of the reference sample with the second illumination beam; and
a controller communicatively coupled to the first and second interferometers, the controller including one or more processors configured to execute program instructions causing the one or more processors to:
receive first and second interference signals from the first and second interferometers including interference fringe strengths of the first and second interferograms as the translation stage scans the reference sample along the measurement direction; and
determine a thickness of the test sample along the measurement direction based on the thickness of the reference sample and a distance travelled by the translation stage between peaks of envelopes of the first and second interference signals.

16. The system of claim 15, wherein widths of the envelopes of the first and second interference signals are associated with a temporal coherence length of the illumination from the illumination source.

17. The system of claim 15, wherein the first and second interferometers focus the first and second illumination beams to opposing points of the first and second surfaces of the test sample, wherein the thickness of the test sample along the measurement direction includes a single thickness measurement between the opposing points.

18. The system of claim 17, wherein the first and second interferometers include single-pixel detectors.

19. The system of claim 15, wherein the first and second interferometers direct the first and second illumination beams as collimated beams to opposing regions of the first and second surfaces of the test sample, wherein the thickness of the test sample along the measurement direction is associated with a plurality of thickness measurements between the opposing regions.

20. The system of claim 19, wherein the first and second interferometers include multi-pixel detectors, wherein the first and second interference signals each include a plurality of signals associated with a plurality of opposing points on the first and second surfaces of the test sample within the opposing regions.

21. The system of claim 15, wherein at least one of the first and second interferometers is configured as a Michelson interferometer.

22. The system of claim 15, wherein at least one of the first and second interferometers is configured as a Linnik interferometer.

23. The system of claim 15, wherein the controller samples the first and second interference signals at selected translation stage positions to create sampled first and second interference signals.

24. The system of claim 23, wherein the controller includes an analog to digital converter to sample the first and second interference signals.

25. The system of claim 24, wherein the analog to digital converter samples the first and second interference signals upon receiving hardware position triggers at the selected translation stage positions.

26. The system of claim 23, wherein determining a thickness of the test sample along the measurement direction based on the thickness of the reference sample and a distance travelled by the translation stage between peaks of envelopes of the first and second interference signals comprises:
reconstructing the first and second interference signals from the sampled first and second interference signals;
determining the envelopes of the first and second interference signals based on the reconstructed first and second interference signals;
determining peak locations of the translation stage at the peaks of the first and second interference signals; and
determining the distance travelled by the translation stage between the peaks of the envelopes of the first and second interference signals based on the peak locations.

27. The system of claim 26, wherein determining locations of the translation stage at the peaks of the first and second interference signals comprises:
- obtaining phases of the first and second interference signals in vicinities around the peaks; and
- identifying the peak locations as locations where the phases of the first and second interference signals are zero.

28. A method comprising:
- scanning at least one of a test sample or a reference sample having a known thickness along a measurement direction;
- receiving a first interference signal from a first interferometer associated with a first interferogram between a first surface of the test sample and a first surface of the reference sample with a first illumination beam, wherein the first illumination beam includes a first portion of an illumination beam from a beamsplitter;
- receiving a second interference signal from a second interferometer associated with a second interferogram between a second surface of the test sample and a second surface of the reference sample with a second illumination beam, wherein the second illumination beam includes a second portion of the illumination beam from the beamsplitter; and
- determining a thickness of the test sample along the measurement direction based on the thickness of the reference sample and a distance travelled by a translation stage between peaks of envelopes of the first and second interference signals.

29. The method of claim 28, wherein determining a thickness of the test sample along the measurement direction based on the thickness of the reference sample and a distance travelled by the translation stage between peaks of envelopes of the first and second interference signals comprises:
- sampling the first and second interference signals at selected intervals to create sampled first and second interference signals;
- reconstructing the first and second interference signals from the sampled first and second interference signals to generate reconstructed first and second interference signals;
- determining the envelopes of the first and second interference signals based on the reconstructed first and second interference signals;
- determining peak locations of the peaks of the first and second interference signals; and
- determining the distance travelled by the translation stage between the peaks of the envelopes of the first and second interference signals based on the peak locations.

* * * * *